United States Patent
Takahara

(10) Patent No.: US 8,102,225 B2
(45) Date of Patent: Jan. 24, 2012

(54) ACOUSTIC WAVE FILTER DEVICE

(75) Inventor: Seiichi Takahara, Ishikawa-ken (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 164 days.

(21) Appl. No.: 12/627,165

(22) Filed: Nov. 30, 2009

(65) Prior Publication Data

US 2010/0066462 A1 Mar. 18, 2010

Related U.S. Application Data

(63) Continuation of application No. PCT/JP2008/058040, filed on Apr. 25, 2008.

(30) Foreign Application Priority Data

Jun. 6, 2007 (JP) ................................ 2007-150061

(51) Int. Cl.
*H03H 9/64* (2006.01)
*H03H 9/54* (2006.01)

(52) U.S. Cl. ................ 333/195; 310/313 D; 310/313 B; 333/196

(58) Field of Classification Search .......... 333/193–196; 310/313 B, 313 C, 313 D
See application file for complete search history.

(56) References Cited

U.S. PATENT DOCUMENTS

| | | | | |
|---|---|---|---|---|
| 3,600,710 A * | 8/1971 | Adler et al. | ..................... | 333/193 |
| 6,353,372 B1 * | 3/2002 | Baier et al. | ..................... | 333/195 |
| 6,496,086 B2 * | 12/2002 | Tsuzuki et al. | ............... | 333/195 |
| 6,667,673 B1 * | 12/2003 | Strauss | ......................... | 333/195 |
| 6,759,928 B2 * | 7/2004 | Endou et al. | .................. | 333/193 |
| 6,853,269 B2 * | 2/2005 | Nakamura et al. | ............ | 333/193 |
| 6,989,724 B2 * | 1/2006 | Watanabe et al. | ............. | 333/133 |
| 2002/0109431 A1 | 8/2002 | Yata et al. | | |
| 2002/0135442 A1 | 9/2002 | Sawada et al. | | |
| 2003/0085778 A1 | 5/2003 | Yata et al. | | |
| 2003/0160665 A1 | 8/2003 | Hagn et al. | | |
| 2006/0181369 A1 | 8/2006 | Shibahara | | |
| 2007/0229193 A1 | 10/2007 | Shibahara | | |
| 2008/0246560 A1 * | 10/2008 | Detlefsen | ...................... | 333/195 |

FOREIGN PATENT DOCUMENTS

DE 10 2004 048 * 4/2006

(Continued)

OTHER PUBLICATIONS

Machine translation of JP 2001-292050, published Oct. 19, 2001.*

(Continued)

*Primary Examiner* — Barbara Summons
(74) *Attorney, Agent, or Firm* — Keating & Bennett, LLP

(57) ABSTRACT

An acoustic wave filter device having a greatly reduced size includes a balance-unbalance conversion function and an input/output impedance ratio of about 1. The acoustic wave filter device includes a second IDT of a first acoustic wave filter portion that is connected to an unbalanced terminal. The second IDT includes first and second divided IDT portions which are divided in an overlap width direction and connected in series with each other between the unbalanced terminal and a ground potential. A fifth IDT of a second acoustic wave filter portion connected to the first acoustic wave filter portion includes first and second divided IDT portions which are divided in an acoustic wave propagating direction. The first and second divided IDT portions of the fifth IDT are connected to first and second balanced terminals, respectively.

17 Claims, 6 Drawing Sheets

FOREIGN PATENT DOCUMENTS

| | | | |
|---|---|---|---|
| EP | 1 701 441 | A1 | 9/2006 |
| JP | 03-129915 | A | 6/1991 |
| JP | 11-097966 | A | 4/1999 |
| JP | 2001-292050 | * | 10/2001 |
| JP | 2002-290203 | A | 10/2002 |
| JP | 2002-300005 | A | 10/2002 |
| JP | 2003-124777 | A | 4/2003 |
| JP | 2003-528523 | A | 9/2003 |
| JP | 2005-223810 | * | 8/2005 |
| JP | 2006-229487 | A | 8/2006 |
| WO | 2006/067884 | A1 | 6/2006 |
| WO | 2006/068087 | A1 | 6/2006 |

OTHER PUBLICATIONS

Official Communication issued in International Patent Application No. PCT/JP2008/058040, mailed on Jun. 24, 2008.

Official Communication issued in corresponding Japanese Patent Application No. 2009-517748, mailed on Sep. 20, 2011.

Official Communication issued in corresponding Chinese Patent Application No. 200880018123.0 mailed on Nov. 24, 2011.

* cited by examiner

ACOUSTIC WAVE FILTER DEVICE

BACKGROUND OF THE INVENTION

1. Field of the Invention

The present invention relates to an acoustic wave filter device for use in, for example, an RF stage of a cellular phone, and, more particularly, to an acoustic wave filter device that has a balance-unbalance conversion function.

2. Description of the Related Art

In order to reduce the sizes of cellular phones, surface acoustic wave filter devices are widely used in the RF stages of the cellular phones. When a surface acoustic wave filter device has a balance-unbalance conversion function, it is possible to omit a balun used for balance-unbalance conversion.

Further, in a band-pass filter used in the RF stage, the impedance at a side at which the band-pass filter is connected to an antenna terminal is often different from the input impedance of a differential amplifier that is connected in the stage subsequent to the band-pass filter. In general, the characteristic impedance of an antenna is 50Ω. On the other hand, the input impedance of the differential amplifier that is connected in the stage subsequent to the surface acoustic wave filter device often ranges from about 100Ω to several hundreds Ω. Thus, when a surface acoustic wave filter device has an impedance conversion function, there is no need for a separate circuit for impedance matching.

Therefore, for example, the following Japanese Unexamined Patent Application Publication No. 2002-290203 discloses a surface acoustic wave filter device that has a balance-unbalance conversion function and in which the ratio of the input impedance to the output impedance is 1:4. In this case, if the impedance of an antenna is 50Ω and the input impedance of a differential amplifier is 200Ω, impedance matching can be performed without separately providing a matching circuit.

However, the characteristic impedance of the differential amplifier is varied. If the characteristic impedance of the differential amplifier is much less than 200Ω, an impedance matching circuit has to be additionally provided when the surface acoustic wave filter device disclosed in Japanese Unexamined Patent Application Publication No. 2002-290203 is used. Thus, there is also demand for a surface acoustic wave filter device that has a balance-unbalance conversion function and in which the ratio of the characteristic impedance at an unbalanced terminal side to the characteristic impedance at a first and second balanced terminals side is much less than 1:4.

On the other hand, the following Japanese Unexamined Patent Application Publication No. 2002-300005 discloses a surface acoustic wave filter device that has a balance-unbalance conversion function and has input and output impedances that are substantially equal to each other. FIG. 9 is a schematic plan view that shows an electrode structure of the surface acoustic wave filter device disclosed in Japanese Unexamined Patent Application Publication No. 2002-300005.

In a surface acoustic wave filter device 200, an electrode structure shown in the drawing is formed between an unbalanced terminal 201 and first and second balanced terminals 202 and 203. In other words, a longitudinally coupled resonator type first surface acoustic wave filter 204 is connected between the unbalanced terminal 201 and the first balanced terminal 202. In addition, a longitudinally coupled resonator type second surface acoustic wave filter 205 is connected between the unbalanced terminal 201 and the second balanced terminal 203.

The surface acoustic wave filters 204 and 205 respectively have first to third IDTs 211 to 213 and 221 to 223 that are arranged in this order along a surface acoustic wave propagating direction in which a surface acoustic wave propagates. In addition, reflectors 214 and 215 and reflectors 224 and 225 are respectively arranged at both sides of the surface acoustic wave filters 204 and 205 in the surface acoustic wave propagating direction.

The first and third IDTs 211 and 213 have first and second divided IDT portions 211A and 211B, and 213A and 213B that are provided by dividing each of the first and third IDTs 211 and 213 into two portions in an electrode finger overlap width direction in which electric fingers overlap each other. First ends of the IDTs 211 and 213 are connected in common to the unbalanced terminal 201. Second ends of the IDTs 211 and 213 are connected to a ground potential. A first end of the second IDT 212 in the middle is connected to the ground potential, and a second end is connected to the first balanced terminal 202.

Similarly, in the second surface acoustic wave filter 205, the first and third IDTs 221 and 223 have first and second divided IDT portions 221A and 221B, and 223A and 223B that are provided by dividing each of the first and third IDTs 221 and 223 into two portions in the electrode finger overlap width direction. Then, first ends of the IDTs 221 and 223 are connected in common to the unbalanced terminal 203, and each of second ends is connected to the ground potential. A first end of the IDT 222 is connected to the ground potential, and a second end thereof is connected to the second balanced terminal 203.

Here, in the IDTs 211, 213, 221, and 223, the first and second divided IDT portions 211A and 211B to 223A and 223B, which are provided by dividing the IDTs 211, 213, 221, and 223 in the electrode finger overlap width direction, are connected in series with each other.

In the surface acoustic wave filter device 200, the impedance at a connection point 216 in FIG. 9 is about four times the impedance at the first balanced terminal 202. Similarly, the impedance at a connection point 226 is about four times the impedance at the second balanced terminal 203. In the entire surface acoustic wave filter device 200, the impedance at the unbalanced terminal 201 is substantially equal to the impedance at the first and second balanced terminals 202 and 203.

The surface acoustic wave filter device 200 disclosed in Japanese Unexamined Patent Application Publication No. 2002-300005 has a balance-unbalance conversion function. In addition, the input impedance and the output impedance can be substantially equal to each other. Thus, when the surface acoustic wave filter device 200 is used in the RF stage of a cellular phone, it is possible to omit an impedance matching circuit and to simplify the structure even when the input impedance of a differential amplifier that is connected in the subsequent stage is close to the characteristic impedance of an antenna.

However, in the surface acoustic wave filter device 200, at least the two surface acoustic wave filters 204 and 205 are connected in parallel with the unbalanced terminal 201. Thus, the overall size of the surface acoustic wave filter device 200 has to be large in the surface acoustic wave propagating direction because the first surface acoustic wave filter 204 and the second surface acoustic wave filter 205 are arranged on a piezoelectric substrate in the surface acoustic wave propagating direction. Therefore, it is difficult to reduce the size.

SUMMARY OF THE INVENTION

In view of the above, preferred embodiments of the present invention provide an acoustic wave filter device that has a balance-unbalance conversion function, has input and output impedances substantially equal to each other, and can achieve further size reduction.

A first preferred embodiment of the present invention provides an acoustic wave filter device that includes a piezoelectric substrate, a three-IDT longitudinally coupled resonator type first acoustic wave filter portion including first to third IDTs that are arranged on the piezoelectric substrate in this order along an acoustic wave propagating direction, and first and second reflectors that are arranged on both sides of the first to third IDTs in the acoustic wave propagating direction, and a three-IDT longitudinally coupled resonator type second acoustic wave filter portion including fourth to sixth IDTs that are arranged on the piezoelectric substrate in this order along the acoustic wave propagating direction, and third and fourth reflectors that are arranged on both sides of the fourth to sixth IDTs in the acoustic wave propagating direction. The second IDT includes first and second divided IDT portions divided in an IDT overlap width direction and connected in series with each other, the first divided IDT portion is connected to an unbalanced terminal, and the second divided IDT portion is connected to a ground potential. Ends of the first and third IDTs are electrically connected to ends of the fourth and sixth IDTs, respectively, and the second acoustic wave filter portion is electrically connected to the first acoustic wave filter portion. The fifth IDT includes first and second divided IDT portions of the fifth IDT divided in the acoustic wave propagating direction, and the first and second divided IDT portions of the fifth IDT are connected to first and second balanced terminals, respectively.

A second preferred embodiment of the present invention provides an acoustic wave filter device that includes a piezoelectric substrate, a three-IDT longitudinally coupled resonator type first acoustic wave filter portion including first to third IDTs that are arranged on the piezoelectric substrate in this order along an acoustic wave propagating direction, and first and second reflectors that are arranged on both sides of the first to third IDTs in the acoustic wave propagating direction, and a three-IDT longitudinally coupled resonator type second acoustic wave filter portion including fourth to sixth IDTs that are arranged on the piezoelectric substrate in this order along the acoustic wave propagating direction, and third and fourth reflectors that are arranged on both sides of the fourth to sixth IDTs in the acoustic wave propagating direction. The second IDT includes first and second divided IDT portions divided in the acoustic wave propagating direction and connected in series with each other, the first divided IDT portion is connected to an unbalanced terminal, and the second divided IDT portion is connected to a ground potential. Ends of the first and third IDTs are electrically connected to ends of the fourth and sixth IDTs, respectively, and the second acoustic wave filter portion is electrically connected to the first acoustic wave filter portion. The fifth IDT includes first and second divided IDT portions divided in the acoustic wave propagating direction, and the first and second divided IDT portions of the fifth IDT are connected to first and second balanced terminals, respectively.

A third preferred embodiment of the present invention provides an acoustic wave filter device that is a three-IDT longitudinally coupled resonator type acoustic wave filter device that includes a piezoelectric substrate, first to third IDTs arranged on the piezoelectric substrate in this order along an acoustic wave propagating direction, and first and second reflectors arranged on both sides of the first to third IDTs in the acoustic wave propagating direction. The first and third IDTs include first and second divided IDT portions divided in an electrode finger overlap width direction and connected in series with each other, the first divided IDT portion of the first IDT and the first divided IDT portion of the third IDT are connected in common to an unbalanced terminal, and each of the second divided IDT portions of the first and third IDTs is connected to a ground potential. The second IDT includes first and second divided IDT portions divided in the acoustic wave propagating direction, and the first and second divided IDT portions are connected to first and second balanced terminals, respectively.

A fourth preferred embodiment of the present invention provides an acoustic wave filter device that is a five-IDT longitudinally coupled resonator type acoustic wave filter device that includes a piezoelectric substrate, first to fifth IDTs arranged on the piezoelectric substrate in this order along an acoustic wave propagating direction, and first and second reflectors arranged on both sides of the first to fifth IDTs in the acoustic wave propagating direction. The first, third, and fifth IDTs include first and second divided IDT portions divided in an electrode finger overlap width direction and connected in series with each other, respectively. The first divided IDT portions of the first, third, and fifth IDTs are connected in common to an unbalanced terminal, and each of the second divided IDT portions of the first, third, and fifth IDTs is connected to a ground potential. The second and fourth IDTs are connected to first and second balanced terminals, respectively.

In the first to fourth preferred embodiments of the present invention, series weighting may be applied to the IDTs that include the first and second divided IDT portions.

Alternatively, metallization ratios of the first and second divided IDT portions may be different from each other.

By so doing, the difference of reception excitation intensity between the first and second divided IDT portions can be reduced. Therefore, it is possible to minimize and prevent a ripple that is generated within a pass band.

A surface acoustic wave or a boundary acoustic wave may be used as an acoustic wave in any of the preferred embodiments of the present invention. When the surface acoustic wave is used, a surface acoustic wave filter device is constructed in accordance with any of the preferred embodiments of the present invention. When the boundary acoustic wave is used, a boundary acoustic wave filter device is provided in accordance with any of the preferred embodiments of the present invention. In the case of the boundary acoustic wave filter device, a dielectric substance layer laminated on the piezoelectric substrate may also be preferably provided, and an electrode structure that includes the aforementioned IDTs and reflectors is disposed on the boundary surface between the piezoelectric substrate and the dielectric substance layer.

In the acoustic wave filter device according to the first preferred embodiment of the present invention, the three-IDT longitudinally coupled resonator type first and second acoustic wave filter portions are electrically connected to each other by connecting the one ends of the first and third IDTs to the one ends of the fourth and sixth IDTs, the second IDT is divided into two portions in the overlap width direction, and the fifth IDT is divided into two portions in the acoustic wave propagating direction. Thus, the impedance at the unbalanced terminal is substantially equal to the impedance at the first and second balanced terminals side. In addition, the acoustic wave filter device has a balance-unbalance conversion function. Further, because the three-IDT type second acoustic wave filter portion is connected in the stage subsequent to the three-IDT type first acoustic wave filter, the size can be small in the acoustic wave propagating direction as compared with that in the case of the surface acoustic wave filter device 200 disclosed in Japanese Unexamined Patent Application Publication No. 2002-300005. Thus, it is also possible to reduce the size of the acoustic wave filter device.

In the acoustic wave filter device according to the second preferred embodiment of the present invention, the three-IDT type second acoustic wave filter portion is connected in the stage subsequent to the three-IDT type first acoustic wave filter portion, the second IDT is divided into two portions in the acoustic wave propagating direction, and the fifth IDT is divided into two portions in the acoustic wave propagating direction. Due to this structure, the impedance at the unbalanced terminal is substantially equal to the impedance at the first and second balanced terminals. In addition, in the second preferred embodiment of the present invention as well, because the second acoustic wave filter portion is connected in the stage subsequent to the three-IDT type first acoustic wave filter portion, the size can be small in the acoustic wave propagating direction. Thus, it is also possible to reduce the size of the acoustic wave filter device.

In the acoustic wave filter device according to the third preferred embodiment of the present invention, in the three-IDT longitudinally coupled resonator type acoustic wave filter device in which the first to third IDTs are arranged on the piezoelectric substrate, the first and third IDTs are divided in the overlap width direction, and the second IDT is divided into two portions in the acoustic wave propagating direction. Thus, the impedance at the unbalanced terminal side is substantially equal to the impedance at the first and second balanced terminals. In addition, due to the three-IDT longitudinally coupled resonator type acoustic wave filter device, the size can be small in the acoustic wave propagating direction, and it is also possible to reduce the size of the acoustic wave filter device.

In the acoustic wave filter device according to the fourth preferred embodiment of the present invention, in the five-IDT longitudinally coupled resonator type acoustic wave filter device, the first, third, and fifth IDTs are divided in the overlap width direction and connected to the unbalanced terminal, and the second and fourth IDTs are connected to the first and second balanced terminals. Thus, the impedance at the unbalanced terminal side can be substantially equal to the impedance at the first and second balanced terminals. In addition, because it is only necessary to provide one longitudinally coupled resonator type acoustic wave filter portion having first to fifth IDTs, the size can be small in the acoustic wave propagating direction. Thus, it is also possible to reduce the size of the acoustic wave filter device.

Other features, elements, steps, characteristics and advantages of the present invention will become more apparent from the following detailed description of preferred embodiments of the present invention with reference to the attached drawings.

DETAILED DESCRIPTION OF THE PREFERRED EMBODIMENTS

Hereinafter, specific preferred embodiments of the invention will be described with reference to the accompanying drawings to clarify the present invention.

Figure 1:
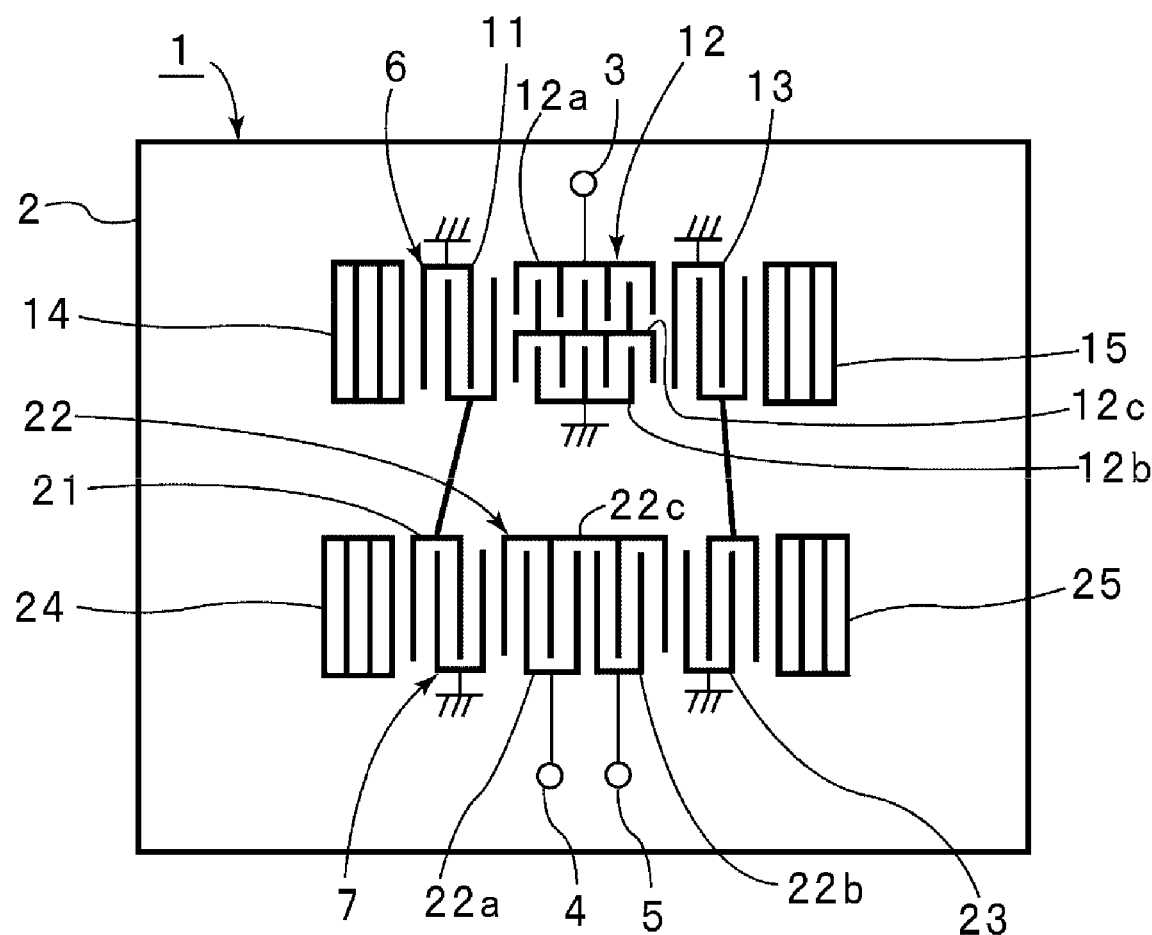
FIG. 1 is a schematic plan view of an acoustic wave filter device according to a first preferred embodiment of the present invention.

FIG. 1 is a schematic plan view of an acoustic wave filter device according to a first preferred embodiment of the present invention.

The acoustic wave filter device 1 includes a piezoelectric substrate 2. The piezoelectric substrate 2 is made of a piezoelectric monocrystal or a piezoelectric ceramic, such as $LiTaO_3$ and $LiNbO_3$, for example. On the piezoelectric substrate 2, an electrode structure shown in the drawing is arranged so as to be connected to an unbalanced terminal 3 and first and second balanced terminals 4 and 5. As a result of this electrode structure, a first acoustic wave filter portion 6 and a second acoustic wave filter portion 7 are provided.

The first and second acoustic wave filter portions 6 and 7 preferably are three-IDT longitudinally coupled resonator type surface acoustic wave filters.

In the first acoustic wave filter portion 6, first to third IDTs 11 to 13 are arranged along a surface acoustic wave propagating direction in which a surface acoustic wave propagates. First and second reflectors 14 and 15 are arranged in the surface acoustic wave propagating direction on both sides of the portion in which the first to third IDTs 11 to 13 are provided.

The second IDT 12 has first and second divided IDT portions 12a and 12b that are provided by dividing the second IDT 12 into two portions in an overlap width direction. The first divided IDT portion 12a and the second divided IDT portion 12b are connected in series with each other. One end of the first divided IDT portion 12a is connected to the unbalanced terminal 3. The first divided IDT portion 12a and the second divided IDT portion 12b are connected in series with each other via a common bus bar 12c. An end of the second divided IDT portion 12b is connected to a ground potential. The IDT 12 that is divided into two portions in the overlap width direction has a characteristic impedance that is four times the characteristic impedance of an imaginary IDT that corresponds to the IDT 12 that has not been divided.

On the other hand, each of first ends of the first and third IDTs 11 and 13 is connected to the ground potential. In the second acoustic wave filter portion 7, fourth to sixth IDTs 21 to 23 are arranged in this order along the surface acoustic wave propagating direction. Third and fourth reflectors 24 and 25 are arranged on both sides of the portion in which the IDTs 21 to 23 are provided. First ends of the fourth and sixth IDTs 21 and 23 are electrically connected to ends of the first and third IDTs 11 and 13, respectively, and second ends of the IDTs 21 and 23 are connected to the ground potential.

On the other hand, the fifth IDT 22 includes first and second divided IDT portions 22a and 22b that are provided by dividing the fifth IDT 22 into two portions in the surface acoustic wave propagating direction. Bus bars of the first and second divided IDT portions 22a and 22b are combined to form a common bus bar 22c. The first and second divided IDT portions 22a and 22b are connected to the first and second balanced terminals 4 and 5, respectively.

In the present preferred embodiment, the IDTs 11 and 13 are arranged such that the phase of a signal flowing in the IDT 11 and the phase of a signal flowing in the IDT 13 are inverted with respect to each other. By so doing, with respect to the phase of a signal inputted from the unbalanced terminal 3, the phase of a signal extracted from the first balanced terminal 4 is different by 180 degrees from the phase of a signal extracted from the second balanced terminal 5. Thus, the acoustic wave filter device 1 having a balance-unbalance conversion function is provided.

It is noted that the electrode structure shown in the drawing can be formed from an appropriate metal such as Al, Cu, Ag, or alloys thereof, for example.

One of the unique features of the present preferred embodiment is that the second IDT 12 is divided in the overlap width direction to provide the first and second divided IDT portions 12a and 12b that are connected in series with each other between the unbalanced terminal and the ground potential, and the fifth IDT 22 is divided into two portions in the surface acoustic wave propagating direction to provide the first and second divided IDT portions 22a and 22b, such that the input/output impedance ratio is substantially 1.

As described above, the impedance of the second IDT 12 is four times the impedance of the second IDT 12 that is not divided.

In other words, an impedance Z is proportional to the inverse number of the log of the impedance multiplied by the overlap width. Thus, when the IDT 12 is divided into two portions in the overlap width direction, the characteristic impedance of the IDT 12 becomes four times the characteristic impedance of the IDT 12 that is not divided, because the overlap width of the divided IDT portions is reduced to ½.

In contrast, because the IDT 22 is divided into two portions in the surface acoustic wave propagating direction, the characteristic impedance of the IDT 22 is also four times the characteristic impedance of the IDT 22 that is not divided.

The fact that the impedances of the IDTs 12 and 22 are about four times the IDTs 12 and 22 that are not divided, will be explained with reference to each schematic view of FIGS. 2A to 2C.

Figure 2A:
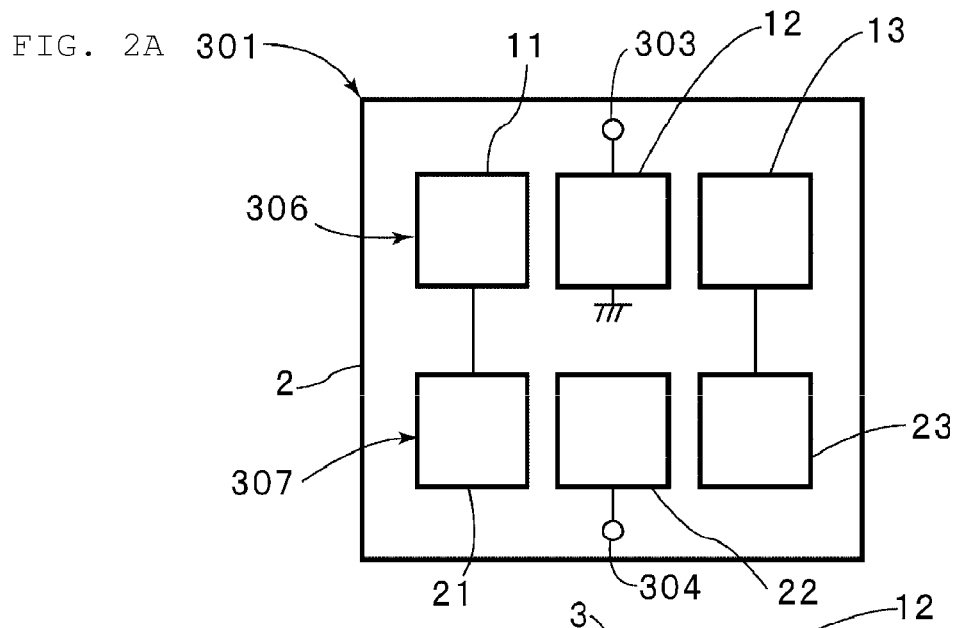
FIGS. 2A and 2B are schematic plan views of surface acoustic wave filter devices from which the surface acoustic wave filter device of the first preferred embodiment of the present invention is derived.
Figure 2B:
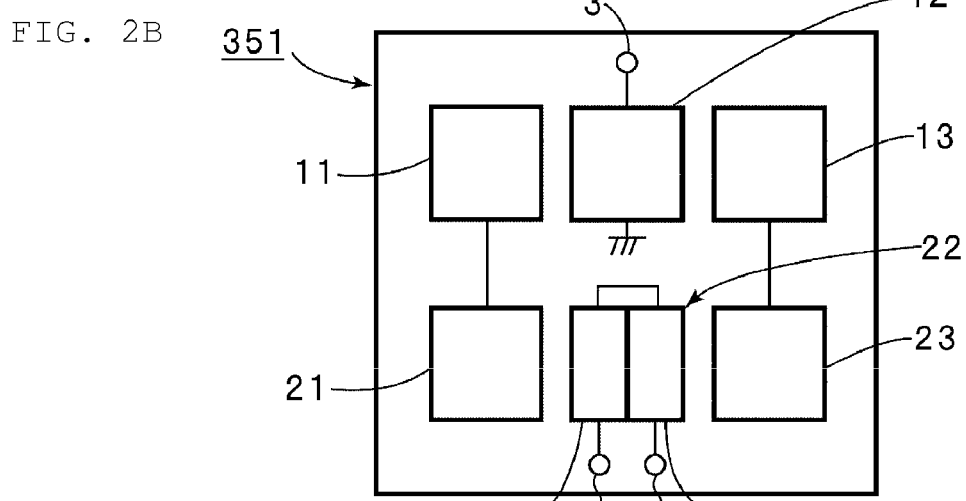
Figure 2C:
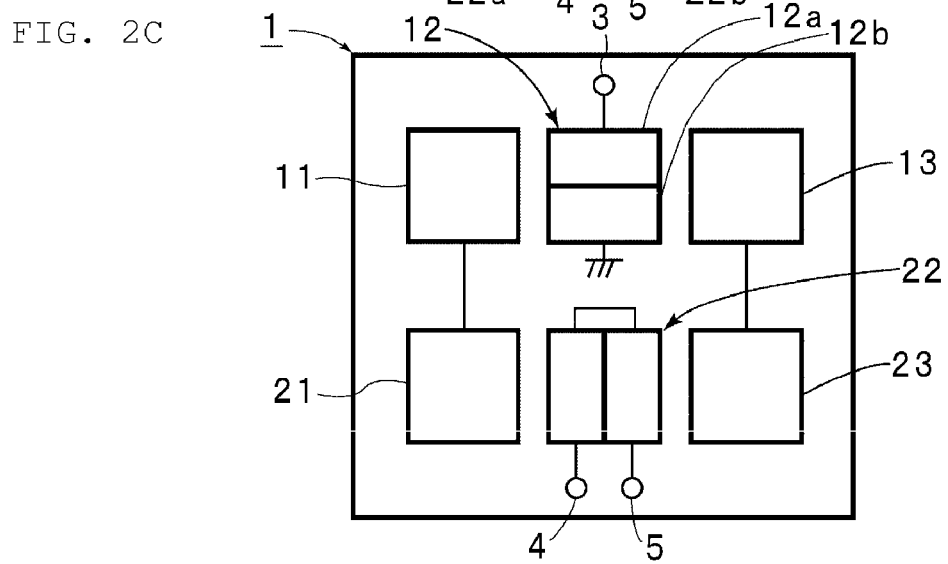
FIG. 2C is a schematic view of the surface acoustic wave filter device according to the first preferred embodiment of the present invention.

FIG. 2C is a schematic view of the surface acoustic wave filter device of the first preferred embodiment, and FIGS. 2A and 2B are schematic plan views of surface acoustic wave filter devices from which the surface acoustic wave filter device of the first preferred embodiment is derived. Here, IDTs of the surface acoustic wave filter devices are schematically shown by using rectangular blocks. It is noted that in FIGS. 2A and 2B, elements corresponding to those in FIGS. 1 and 2C are designated by the corresponding reference numerals, and the detailed description thereof is omitted.

In the surface acoustic wave filter device 301 shown in FIG. 2A, a schematically shown electrode structure is disposed on the piezoelectric substrate 2. Here, although only the IDTs are shown by using the rectangular blocks, it is noted that reflectors are omitted in the drawing. Three-IDT type first and second surface acoustic wave filters 306 and 307 are connected to each other between an input terminal 303 and an output terminal 304. The first surface acoustic wave filter 306 has first to third IDTs 11 to 13, and the second surface acoustic wave filter 307 includes fourth to sixth IDTs 21 to 23. Here, each of the characteristic impedances of the first to sixth IDTs 11 to 13 and 21 to 23 is Z. The ratio of the input impedance to the output impedance is 2:2, namely, 1:1.

With respect to the surface acoustic wave filter device 301, in the surface acoustic wave filter device 351 shown in FIG. 2B, the fifth IDT 22 is divided into two portions in the surface acoustic wave propagating direction to provide the first and second divided IDT portions 22a and 22b, similarly as in the preferred embodiment shown in FIG. 1. The IDTs 22a and 22b are connected in series with each other, the first divided IDT portion 22a is connected to the first balanced terminal 4, and the first divided IDT portion 22b is connected to the second balanced terminal 5. In this structure, the input impedance is the characteristic impedance Z of the IDT 12, and hence Z. In addition, because the IDT 22 is divided in the overlap width direction to form the first and second divided IDT portions, each of the characteristic impedances at the divided IDT portions 22a and 22b is 2Z. Further, because the divided IDT portion 22a and the divided IDT portion 22b are connected in series with each other, the impedance between the first and second balanced terminals 4 and 5 becomes 4Z. Therefore, the ratio of the input impedance to the output impedance is 1:4.

In contrast, in the surface acoustic wave filter device 351 shown in FIG. 2B, when the second IDT 12 at the input side is also divided into two portions in the overlap width direction as shown in FIGS. 1 and 2C, each of the characteristic impedances of the divided IDT portions 12a and 12b provided by the division into two portions becomes 2Z. Then, because the divided IDT portion 12a and the divided IDT portion 12b are connected in series with each other, the input impedance becomes 4Z. Thus, the ratio of the input impedance to the output impedance is 1:1. Therefore, in the preferred embodiment shown in FIG. 1, it appears that the ratio of the characteristic impedance at the unbalanced terminal 3 to the impedance extracted from the first and second balanced terminals 4 and 5 can be about 1:1.

Moreover, the input/output impedance ratio is about 1, but the size does not increase in the surface acoustic wave propagating direction. In the existing example shown in FIG. 9, the first and second surface acoustic wave filters 204 and 205 have to be arranged in the surface acoustic wave propagating direction. In contrast, in the present preferred embodiment, it is only necessary to connect the three-IDT longitudinally coupled resonator type second acoustic wave filter portion 7 in the stage subsequent to the three-IDT longitudinally coupled resonator type first acoustic wave filter portion 6, and hence the length in an acoustic wave propagating direction in which an acoustic wave propagates does not become large. Thus, in the acoustic wave filter device 1, it is possible to reduce the size.

Figure 3:
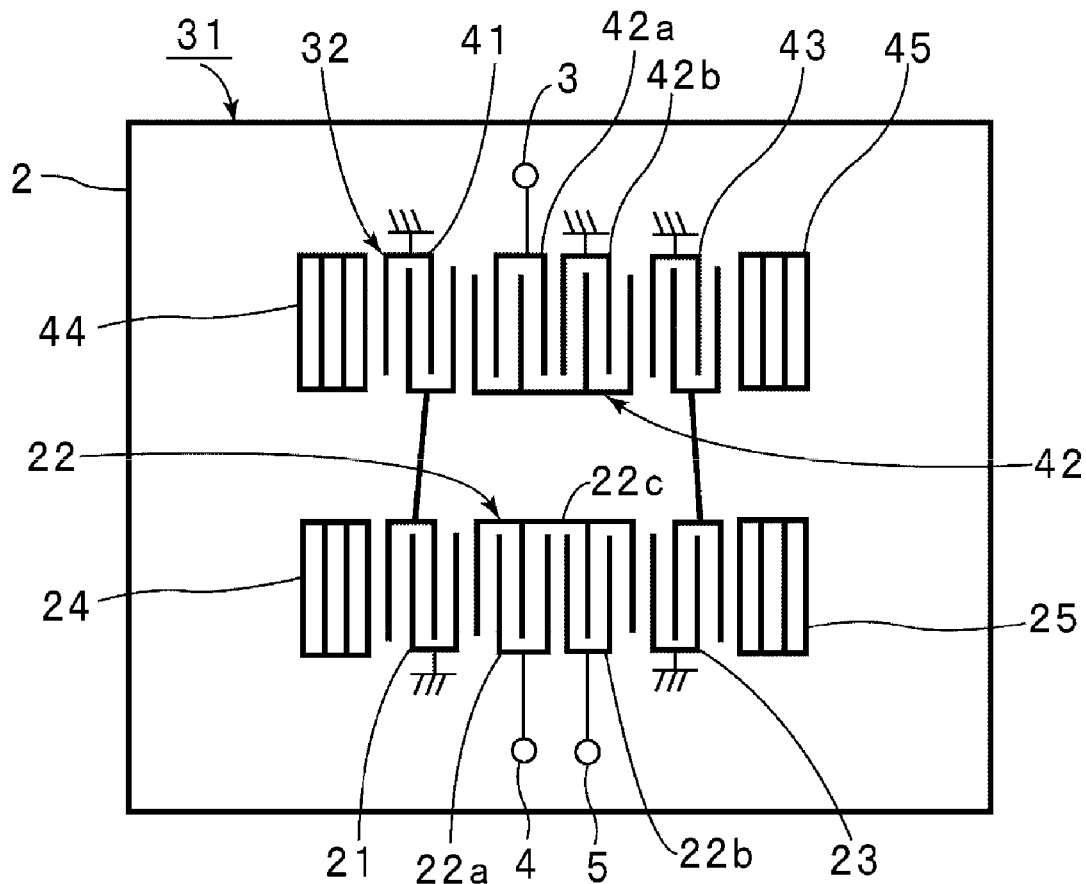
FIG. 3 is a schematic plan view of an acoustic wave filter device according to a second preferred embodiment of the present invention.

FIG. 3 is a schematic plan view of an acoustic wave filter device 31 according to a second preferred embodiment of the present invention. Here, the acoustic wave filter device 31 is preferably constructed in a similar manner to that of the first preferred embodiment, except that a first acoustic wave filter portion 32 shown in FIG. 3 is provided instead of the first acoustic wave filter portion 6 shown in FIG. 1. Thus, only the difference will be mainly described.

The first acoustic wave filter portion 32 preferably is a three-IDT longitudinally coupled resonator type surface acoustic wave filter. Here, first to third IDTs 41 to 43 are arranged in this order along the surface acoustic wave propagating direction, and first and second reflectors 44 and 45 are disposed in the surface acoustic wave propagating direction on both sides of the portion in which the IDTs 41 to 43 are provided. The second preferred embodiment differs from the first preferred embodiment in that the second IDT 42 is divided into two portions in the surface acoustic wave propagating direction to provide first and second divided IDT portions 42a and 42b, and in that the unbalanced terminal 3 is connected to the first divided IDT portion 42a and the second divided IDT portion 43b is connected to the ground potential. In other words, the first and second divided IDT portions 42a and 42b are connected in series with each other between the unbalanced terminal 3 and the ground potential. Therefore, the impedance at the unbalanced terminal 3 is four times the impedance of an IDT that corresponds to the IDT 42 that has not been divided.

In the present preferred embodiment as well, the phase of the first IDT 41 and the phase of the third IDT 43 are inverted with respect to each other, thereby realizing a balance-unbalance conversion function. In other words, the phases of the IDTs 41 and 43 are inverted with respect to each other such that the phase of a signal extracted from the second balanced terminal 5 is different by 180 degrees from the phase of a signal extracted from the first balanced terminal 4.

In the present preferred embodiment, as described above, the impedance at the unbalanced terminal 3 is four times the characteristic impedance of the IDT that corresponds to the IDT 42 that has not been divided, and the characteristic impedance between the first and second balanced terminals 4 and 5 is also four times the characteristic impedance of an IDT that corresponds to the IDT 22 that has not been divided, similarly as in the first preferred embodiment. Therefore, in the present preferred embodiment as well, the ratio of the input impedance to the output impedance can be about 1.

In addition, in the second preferred embodiment, because the second acoustic wave filter portion 7 is connected in the stage subsequent to the three-IDT longitudinally coupled resonator type first acoustic wave filter portion 32, the input/output impedance ratio can be 1 without increasing the size in the surface acoustic wave propagating direction. Thus, in the acoustic wave filter device 31 as well, it is possible to reduce the size.

Figure 4:
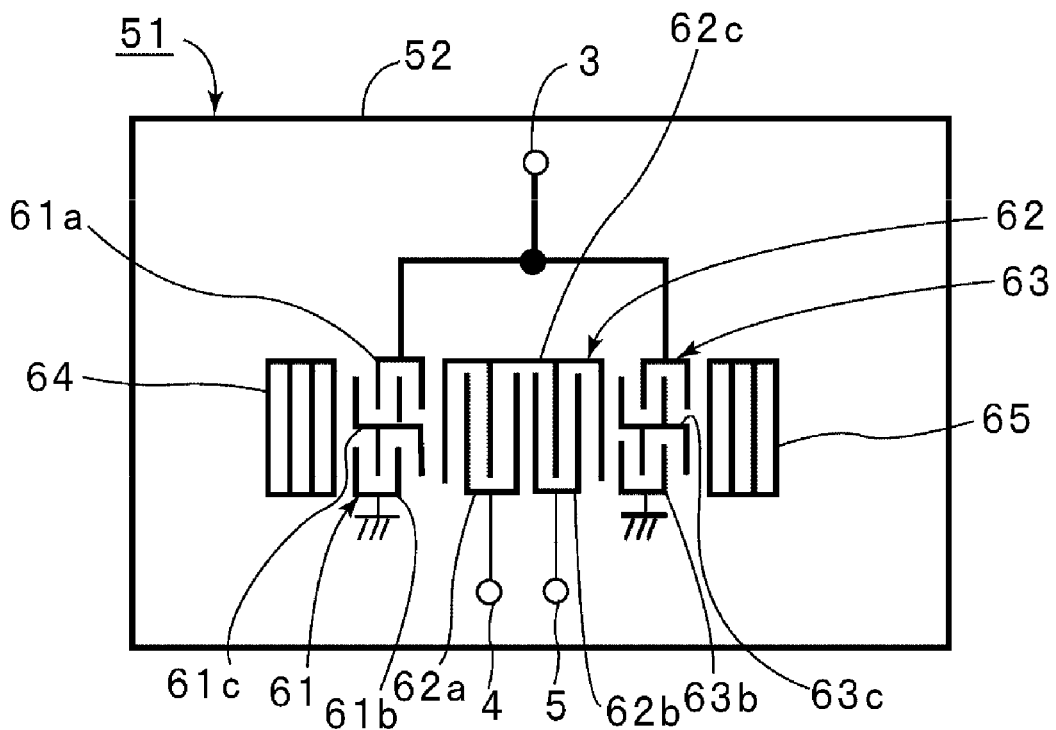
FIG. 4 is a schematic plan view of an acoustic wave filter device according to a third preferred embodiment of the present invention.

FIG. 4 is a schematic plan view of an acoustic wave filter device according to a third preferred embodiment of the present invention. The acoustic wave filter device 51 of the third preferred embodiment preferably is a three-IDT longitudinally coupled resonator type surface acoustic wave filter. In the surface acoustic wave filter device 51, first to third IDTs 61 to 63 are arranged on a piezoelectric substrate 52 in this order along the surface acoustic wave propagating direction. First and second reflectors 64 and 65 are arranged in the surface acoustic wave propagating direction on both sides of the portion in which the IDTs 61 to 63 are provided.

The IDTs 61 and 63 have first and second divided IDT portions 61a and 61b, and 63a and 63b that are provided by dividing each of the IDTs 61 and 63 into two portions in the overlap width direction. The first divided IDT portion 61a and the second divided IDT portion 61b are connected in series with each other via a common bus bar 61c, and an end of the IDT 61a is connected to the unbalanced terminal 3. An end of the IDT 61b is connected to the ground potential.

Similarly, in the third IDT 63, the first divided IDT portion 63a and the second divided IDT portion 63b are connected in series with each other via a common bus bar 63c. An end of the IDT 63a and an end of the IDT 61a are connected in common to the unbalanced terminal 3, and an end of the second divided IDT portion 63b is connected to the ground potential.

On the other hand, the second IDT 62 has first and second divided IDT portions 62a and 62b that are provided by dividing the second IDT 62 into two portions in the surface acoustic wave propagating direction. Bus bars of the divided IDT portions 62a and 62b are combined to define a common bus bar 62c. An end of the divided IDT portion 62a is connected to the first balanced terminal 4, and an end of the divided IDT portion 62b is connected to the second balanced terminal 5.

In the present preferred embodiment, the phase of the IDT 61 and the phase of the IDT 63 are inverted with respect to each other such that the phase of a signal extracted from the first balanced terminal 4 is different by 180 degrees from the phase of a signal extracted from the second balanced terminal 5. Thus, a balance-unbalance conversion function is provided.

In addition, because the first divided IDT portions 61a and 63a are connected in series with the second divided IDT portions 61b and 63b in the IDTs 61 and 63, the impedances of the IDTs 61 and 63 are four times the impedances of IDTs that correspond to the IDTs 61 and 63 that have not been divided.

On the other hand, in the IDT 62, because the first and second divided IDT portions 62a and 62b, which are provided by dividing the IDT 62 into two portions in the surface acoustic wave propagating direction, are connected in series with each other, the output impedance becomes about four times the output impedance of an IDT that corresponds to the IDT 62 that has not been divided. This will be explained with reference to FIGS. 5A to 5C.

Figure 5A:
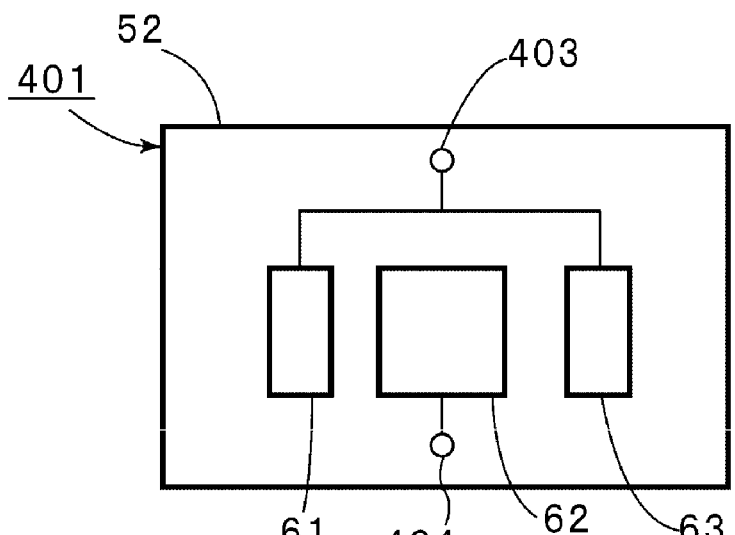
FIGS. 5A and 5B are schematic plan views of surface acoustic wave filter devices from which the surface acoustic wave filter device of the third preferred embodiment of the present invention is derived.
Figure 5B:
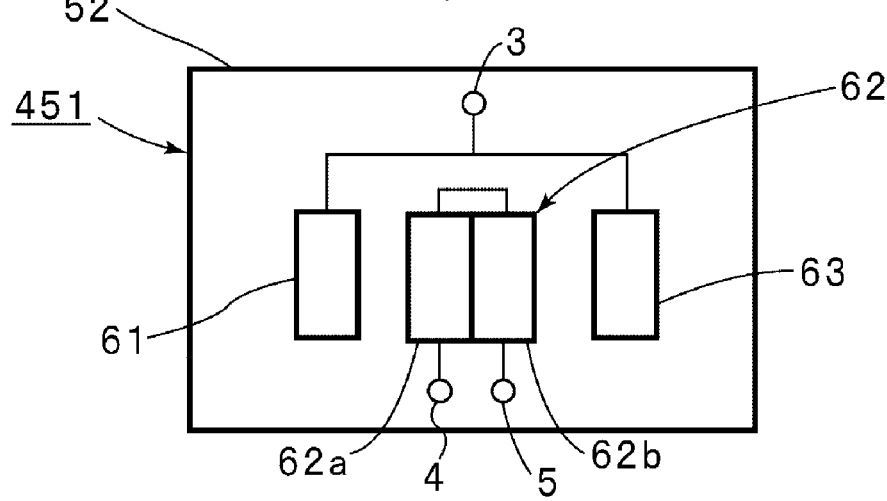
Figure 5C:
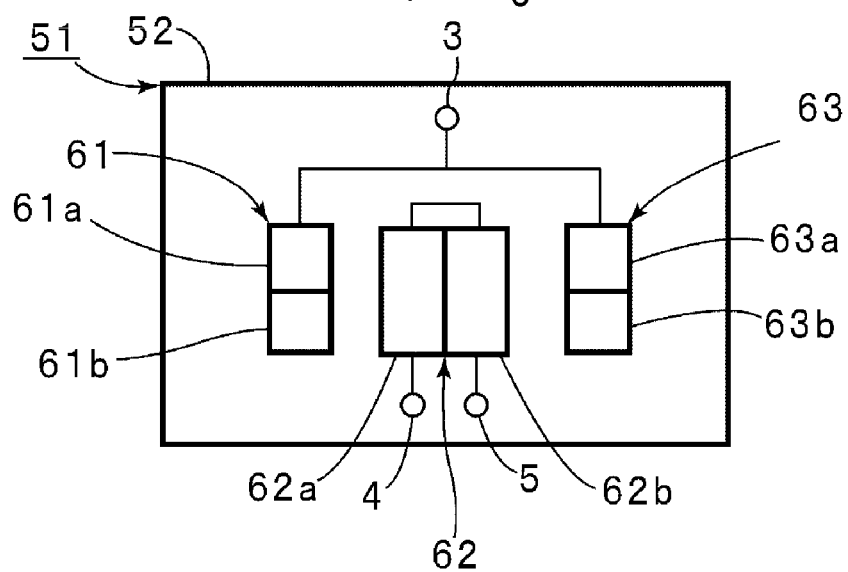
FIG. 5C shows a structure that corresponds to the surface acoustic wave filter device of the third preferred embodiment of the present invention.

In FIGS. 5A to 5C, IDTs of three-IDT longitudinally coupled resonator type surface acoustic wave filters that are disposed on the piezoelectric substrates 52, are schematically shown by using rectangular blocks. Here, similarly as in the case of FIGS. 2A-2C, reflectors are omitted in the drawings. FIG. 5C shows a structure corresponding to the surface acoustic wave filter device 51 of the third preferred embodiment of the present invention, and FIGS. 5A and 5B are schematic plan views of surface acoustic wave filter devices 401 and 451 from which the third preferred embodiment of the present invention is derived. In the surface acoustic wave filter device 401 shown in FIG. 5A in which the IDTs are not divided, the second IDT 62 having a characteristic impedance of Z is disposed between the first and third IDTs 61 and 63 each having a characteristic impedance of 2Z. Therefore, because the first and third IDTs 61 and 63 are connected in parallel with each other, the impedance at an input terminal 403 becomes Z, the impedance at an output terminal 404 becomes Z, and hence the ratio of the input impedance to the output impedance is 1:1.

The surface acoustic wave filter device 451, shown in FIG. 5B, having a balance-unbalance conversion function can be formed by dividing the second IDT 62 in the middle into two portions in the surface acoustic wave propagating direction in the surface acoustic wave filter device 401. In this case, the IDT 62 is divided in the surface acoustic wave propagating direction to provide the first and second divided IDT portions 62a and 62b. The characteristic impedance of the IDT 62a becomes 2Z, and the characteristic impedance of the divided IDT portion 62*b* becomes 2Z. Further, because the first and second divided IDT portions 62*a* and 62*b* are connected in series with each other, the impedance between the first and second balanced terminals 4 and 5 becomes 4Z. Thus, the ratio of the input impedance to the output impedance becomes about 1:4.

In contrast, in the surface acoustic wave filter device 51 of the present preferred embodiment shown schematically in FIG. 5C, the first and third IDTs 61 and 63 that are connected to the unbalanced terminal 3 each are divided into two portions in the overlap width direction to provide the first and second divided IDT portions 61*a* and 61*b*, and 63*a* and 63*b*. Each of the impedances of the divided IDT portions 61*a*, 61*b*, 63*a*, and 63*b* is 4Z. The impedance at the unbalanced terminal 3 becomes 4Z, because the first divided IDT portion 61*a* and the second divided IDT portion 61*b* are connected in series with each other; the first divided IDT portion 63*a* and the second divided IDT portion 63*b* are connected in series with each other; and the IDT 61 and the IDT 63 are connected in parallel with each other. Therefore, the ratio of the impedance at the unbalanced terminal 3 to the impedance at the balanced terminals 4 and 5 can be about 1:1.

As described above, in the present preferred embodiment as well, the ratio of the characteristic impedance at the balanced terminal 3 to the characteristic impedance at the balanced terminals 4 and 5 can be about 1:1.

In the present preferred embodiment, because only the longitudinally coupled resonator type surface acoustic wave filter portion including the first to third IDTs 61 to 63 is provided, the input/output impedance ratio can be about 1 without increasing the size in the acoustic wave propagating direction. Thus, in the acoustic wave filter device 51 as well, it is possible to reduce the size.

Figure 6:
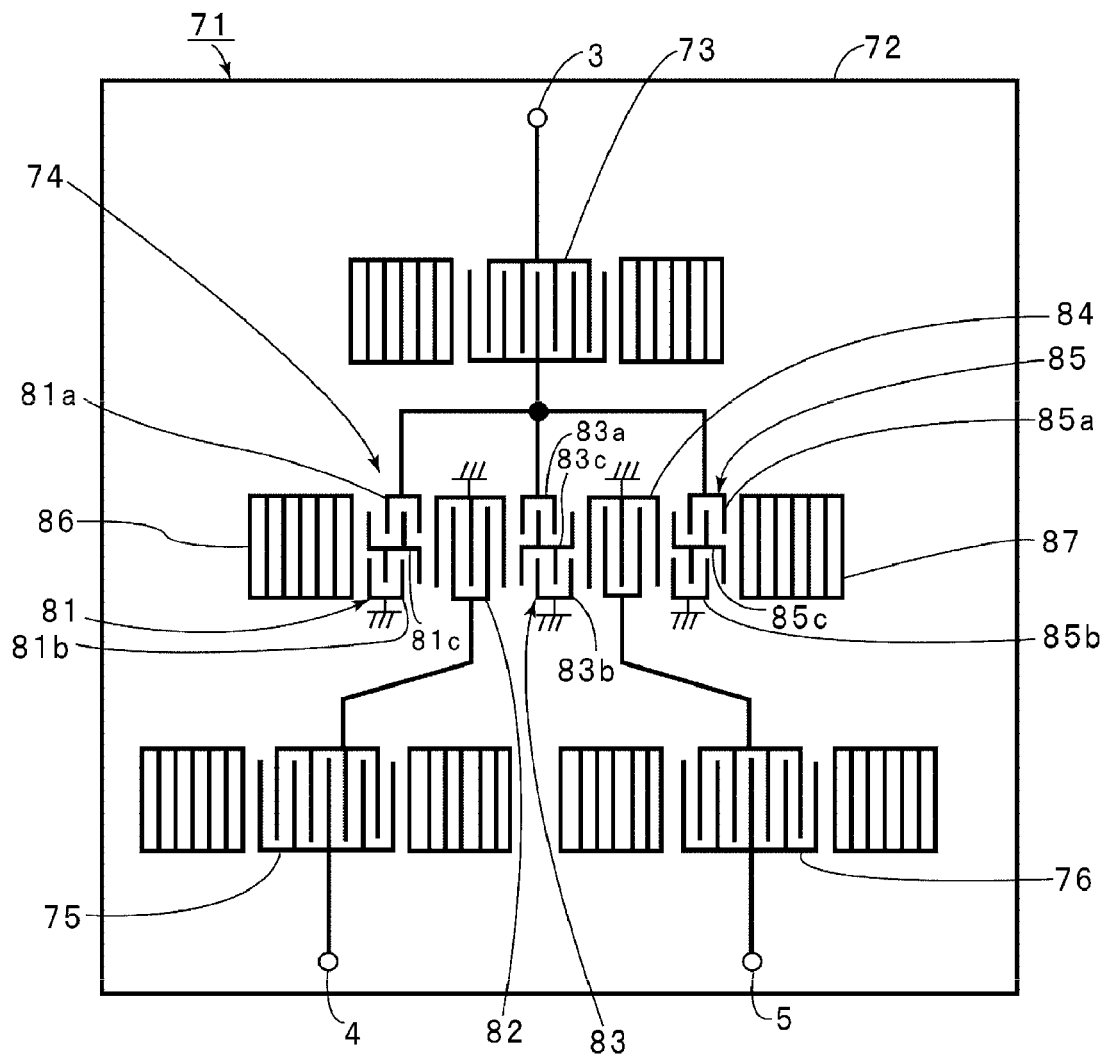
FIG. 6 is a schematic plan view of an acoustic wave filter device according to a fourth preferred embodiment of the present invention.

FIG. 6 is a schematic plan view of an acoustic wave filter device according to a fourth preferred embodiment of the present invention. In the acoustic wave filter device 71 of the fourth preferred embodiment, an electrode structure shown in the drawing is disposed on a piezoelectric substrate 72. Here, a five-IDT longitudinally coupled resonator type acoustic wave filter portion 74 is connected to the unbalanced terminal 3 via a one-port surface acoustic wave resonator 73. The longitudinally coupled resonator type acoustic wave filter portion 74 includes first to fifth IDTs 81 to 85 that are arranged in this order along the surface acoustic wave propagating direction, and reflectors 86 and 87 that are arranged in the surface acoustic wave propagating direction on both sides of the region in which the first to fifth IDTs 81 to 85 are provided.

The first, third, and fifth IDTs 81, 83, and 85 have first and second divided IDT portions 81*a* and 81*b*, 83*a* and 83*b*, and 85*a* and 85*b* that are provided by dividing each of the first, third, and fifth IDTs 81, 83, and 85 into two portions in the overlap width direction. The first divided IDT portions 81*a*, 83*a*, and 85*a* are connected in common to the second divided IDT portions 81*b*, 83*b*, and 85*b* via common bus bars 81*c*, 83*c*, and 85*c*, respectively.

Ends of the first divided IDT portions 81*a*, 83*a*, and 85*a* are connected in common to the unbalanced terminal 3 via the one-port surface acoustic wave resonator 73, and ends of the second divided IDT portions 81*b*, 83*b*, and 85*b* are connected to the ground potential.

On the other hand, each of first ends of the second and fourth IDTs 82 and 84 is connected to the ground potential, and second ends are connected to the first and second balanced terminals 4 and 5 via one-port surface acoustic wave resonators 75 and 76, respectively.

Here, the IDTs 81 to 85 are arranged such that, with respect to a signal inputted from the unbalanced terminal 3, the phase of a signal extracted from the first balanced terminal 4 is different by 180 degrees from the phase of a signal extracted from the second balanced terminal 4. Specifically, the phase of the IDT 82 and the phase of the IDT 84 are inverted with respect to the phases of the IDTs 81 and 83 and the phases of the IDTs 83 and 85, respectively. Thus, a balance-unbalance conversion function is provided.

In contrast, the IDTs 81, 83, and 85 are connected at ends thereof to the ground potential as described above, and include the first and second divided IDT portions 81*a* and 81*b*, 83*a* and 83*b*, and 85*a* and 85*b*, which are connected in series with each other. Thus, the impedances at the IDTs 81, 83, and 85 are four times the impedances at IDTs that correspond to the IDTs 81, 83, and 85 that have not been divided. On the other hand, the first, third, and fifth IDTs 81, 83, and 85 are connected in parallel with the unbalanced terminal 3, and the second and fourth IDTs 82 and 84 are connected to the first and second balanced terminals 4 and 5, respectively. Thus, when the IDTs 81, 83, and 85 are not divided in the overlap width direction, the ratio of the input impedance to the output impedance extracted from the balanced terminals 4 and 5 is 1:4.

Therefore, in the present preferred embodiment, because the IDTs 81, 83, and 85 are arranged so as to increase the impedance four times as described above, the ratio of the impedance at the unbalanced terminal 3 to the impedance at the balanced terminal 4 and 5 can be about 1:1.

It is noted that the one-port surface acoustic wave resonators 73, 75, and 76 may not necessarily be provided.

Figure 9:
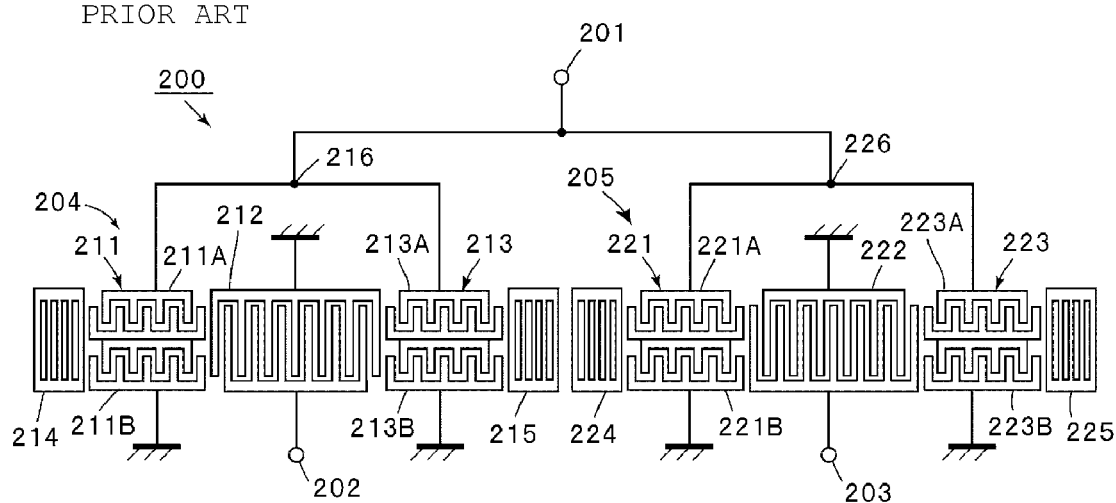
FIG. 9 is a schematic plan view that shows an electrode structure of an existing surface acoustic wave filter device.

In the present preferred embodiment as well, because only the one acoustic wave filter portion is disposed in the surface acoustic wave propagating direction, the size can be small in the surface acoustic wave propagating direction as compared with that in the conventional example shown in FIG. 9 in which the first and second surface acoustic wave filters are arranged in the surface acoustic wave propagating direction. Therefore, in the acoustic wave filter device 71, it is possible to reduce the size.

In the acoustic wave filter device 1 shown in FIG. 1, the IDT 12 is divided in the overlap width direction to provide the first and second divided IDT portions 12*a* and 12*b*. In this case, the drawing is shown such that weighting is not applied to the first and second divided IDT portions 12*a* and 12*b*.

Figure 7:
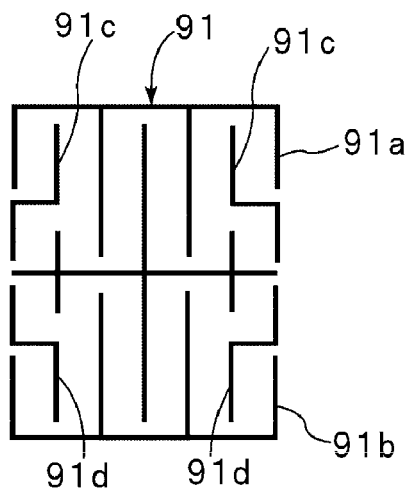
FIG. 7 is a schematic plan view that illustrates an IDT to which series weighting is applied and that is used in a preferred modified example of a preferred embodiment of the present invention.

In a preferred embodiment of the present invention, preferably, as shown in FIG. 7, an IDT in which series weighting is applied to first and second divided IDT portions 91*a* and 91*b* may be used. Here, the first and second divided IDT portions 91*a* and 91*b* have crank-like floating electrode fingers 91*c* and 91*d* at ends thereof in the surface acoustic wave propagating direction, whereby series weighting is applied thereto. Such application of series weighting is known as an example of a method for applying weighting to an IDT, prior to the filing of the present application.

In the IDT 91 that is divided into two portions in the overlap width direction, when series weighting is applied, the difference of reception excitation intensity of surface acoustic waves between the divided IDT portions provided by the division in the overlap width direction can be reduced. Thus, it is possible to reduce a ripple that may be generated within a pass band due to the difference of reception excitation intensity, or it is possible to eliminate the ripple.

When series weighting is applied to the divided IDT portions provided by the division in the overlap width direction, series weighting may be applied to only one of the first and second divided IDT portions, or series weighting may be applied to both of the first and second divided IDT portions as described above. In addition to the first preferred embodiment, in the third preferred embodiment and the fourth preferred embodiment, similarly, series weighting is preferably applied as appropriate to the IDTs 61, 63, 81, 83, and 85 that are divided in the overlap width direction.

Further, in the acoustic wave filter device 1 of the first preferred embodiment, preferably, in the IDT 12 that is divided in the overlap width direction, the metallization ratio at the divided IDT portion 12*a* is different from the metallization ratio at the divided IDT portion 12*b* such that the difference of reception excitation intensity between the divided IDT portions 12*a* and 12*b* is reduced. Thus, it is possible to reduce a ripple that may be generated within the pass band due to the difference of reception excitation intensity, or it is possible to eliminate the ripple.

A metallization ratio is the ratio of the sizes of electrode fingers in the width direction to the size of the electrode fingers in the width direction+space between electrode fingers in an IDT.

Figure 8:
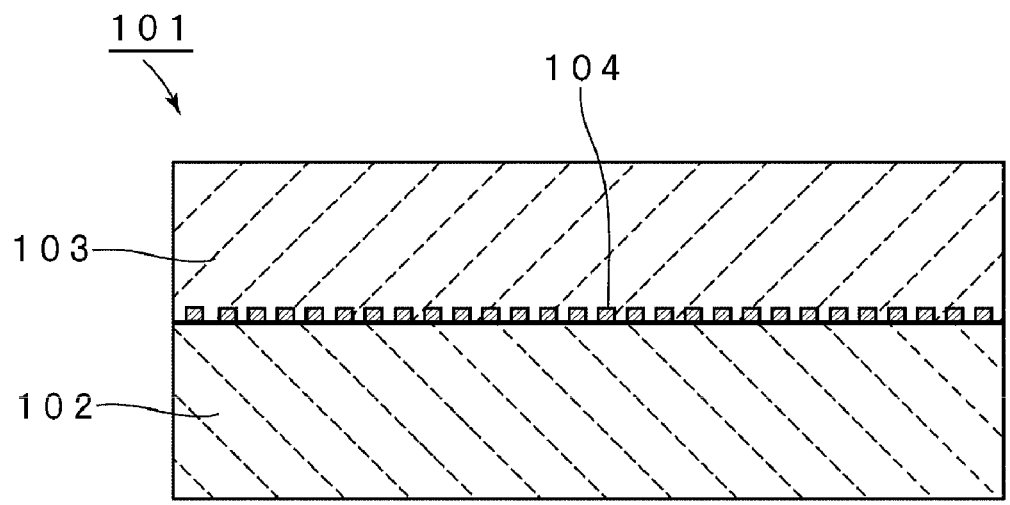
FIG. 8 is a schematic front cross-sectional view that illustrates a structure of a boundary acoustic wave filter device.

Surface acoustic wave filter devices have been described in the above preferred embodiments, but the present invention is applicable to a boundary acoustic wave filter device that uses a boundary acoustic wave. In recent years, in order to simplify a packaged structure as compared with that of a surface acoustic wave filter device, a boundary acoustic wave filter device has been attracting attention. Such a boundary acoustic wave filter device is shown in FIG. 8. In the boundary acoustic wave filter device 101 shown in its schematic front cross-sectional view in FIG. 8, a dielectric substance 103 is laminated on a piezoelectric substrate 102 made of a piezoelectric substance. An electrode structure 104 that includes IDTs is provided on the boundary surface between the piezoelectric substrate 102 and the dielectric substance 103. By forming the electrode structure of each of the aforementioned preferred embodiments as the electrode structure 104, a boundary acoustic wave filter device can be provided in accordance with a preferred embodiment of the present invention.

Such a boundary acoustic wave filter device as well can have a balance-unbalance conversion function by using the electrode structure of a preferred embodiment of the present invention, and it is possible to provide a small-sized filter device in which the input/output impedance ratio can be about 1.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. An acoustic wave filter device comprising:
   a piezoelectric substrate;
   a three-IDT longitudinally coupled resonator type first acoustic wave filter portion including first to third IDTs that are arranged on the piezoelectric substrate in this order along an acoustic wave propagating direction, and first and second reflectors that are arranged on both sides of the first to third IDTs in the acoustic wave propagating direction; and
   a three-IDT longitudinally coupled resonator type second acoustic wave filter portion including fourth to sixth IDTs that are arranged on the piezoelectric substrate in this order along the acoustic wave propagating direction, and third and fourth reflectors that are arranged on both sides of the fourth to sixth IDTs in the acoustic wave propagating direction; wherein
   the second IDT includes first and second divided IDT portions divided in an IDT overlap width direction and connected in series with each other, the first divided IDT portion is connected to an unbalanced terminal, and the second divided IDT portion is connected to a ground potential;
   ends of the first and third IDTs are electrically connected to ends of the fourth and sixth IDTs, respectively, and the second acoustic wave filter portion is electrically connected to the first acoustic wave filter portion;
   the fifth IDT includes first and second divided IDT portions divided in the acoustic wave propagating direction, and the first and second divided IDT portions of the fifth IDT are connected to first and second balanced terminals, respectively; and
   metallization ratios of the first and second divided IDT portions are different from each other in at least one of the second and fifth IDTs.

2. The acoustic wave filter device according to claim 1, wherein series weighting is applied to at least one of the IDTs that include the first and second divided IDT portions.

3. The acoustic wave filter device according to claim 1, wherein a surface acoustic wave is used as an acoustic wave and the acoustic wave filter device is a surface acoustic wave filter device.

4. The acoustic wave filter device according to claim 1, further comprising a dielectric substance layer laminated on the piezoelectric substrate, wherein the acoustic wave filter device is a boundary acoustic wave filter device that uses a boundary acoustic wave as an acoustic wave.

5. An acoustic wave filter device comprising:
   a piezoelectric substrate;
   a three-IDT longitudinally coupled resonator type first acoustic wave filter portion including first to third IDTs that are arranged on the piezoelectric substrate in this order along an acoustic wave propagating direction, and first and second reflectors that are arranged on both sides of the first to third IDTs in the acoustic wave propagating direction; and
   a three-IDT longitudinally coupled resonator type second acoustic wave filter portion including fourth to sixth IDTs that are arranged on the piezoelectric substrate in this order along the acoustic wave propagating direction, and third and fourth reflectors that are arranged on both sides of the fourth to sixth IDTs in the acoustic wave propagating direction; wherein
   the second IDT includes first and second divided IDT portions divided in the acoustic wave propagating direction and connected in series with each other, the first divided IDT portion is connected to an unbalanced terminal, and the second divided IDT portion is connected to a ground potential;
   ends of the first and third IDTs are electrically connected to ends of the fourth and sixth IDTs, respectively, and the second acoustic wave filter portion is electrically connected to the first acoustic wave filter portion;
   the fifth IDT includes first and second divided IDT portions divided in the acoustic wave propagating direction, and the first and second divided IDT portions of the fifth IDT are connected to first and second balanced terminals, respectively; and
   metallization ratios of the first and second divided IDT portions are different from each other in at least one of the second and fifth IDTs.

6. The acoustic wave filter device according to claim 5, wherein series weighting is applied to at least one of the IDTs that include the first and second divided IDT portions.

7. The acoustic wave filter device according to claim 5, wherein a surface acoustic wave is used as an acoustic wave and the acoustic wave filter device is a surface acoustic wave filter device.

8. The acoustic wave filter device according to claim 5, further comprising a dielectric substance layer laminated on the piezoelectric substrate, wherein the acoustic wave filter device is a boundary acoustic wave filter device that uses a boundary acoustic wave as an acoustic wave.

9. An acoustic wave filter device that is a three-IDT longitudinally coupled resonator type acoustic wave filter device, comprising:
   a piezoelectric substrate;
   first to third IDTs arranged on the piezoelectric substrate so as to be arranged in this order along an acoustic wave propagating direction; and
   first and second reflectors arranged on both sides of the first to third IDTs in the acoustic wave propagating direction; wherein
   the first and third IDTs include first and second divided IDT portions divided in an electrode finger overlap width direction and connected in series with each other, respectively, the first divided IDT portion of the first IDT and the first divided IDT portion of the third IDT are connected in common to an unbalanced terminal, and each of the second divided IDT portions of the first and third IDTs is connected to a ground potential; and
   the second IDT includes first and second divided IDT portions divided in the acoustic wave propagating direction, and the first and second divided IDT portions of the second IDT are connected to first and second balanced terminals, respectively.

10. The acoustic wave filter device according to claim 9, wherein series weighting is applied to at least one of the IDTs that include the first and second divided IDT portions.

11. The acoustic wave filter device according to claim 9, wherein metallization ratios of the first and second divided IDT portions are different from each other in at least one of the first, second and third IDTs.

12. The acoustic wave filter device according to claim 9, wherein a surface acoustic wave is used as an acoustic wave and the acoustic wave filter device is a surface acoustic wave filter device.

13. The acoustic wave filter device according to claim 9, further comprising a dielectric substance layer laminated on the piezoelectric substrate, wherein the acoustic wave filter device is a boundary acoustic wave filter device that uses a boundary acoustic wave as an acoustic wave.

14. An acoustic wave filter device that is a five-IDT longitudinally coupled resonator type acoustic wave filter device, comprising:
   a piezoelectric substrate;
   first to fifth IDTs arranged on the piezoelectric substrate in this order along an acoustic wave propagating direction; and
   first and second reflectors arranged on both sides of the first to fifth IDTs in the acoustic wave propagating direction; wherein
   the first, third, and fifth IDTs include first and second divided IDT portions divided in an electrode finger overlap width direction and connected in series with each other, respectively;
   the first divided IDT portions of the first, third, and fifth IDTs are connected in common to an unbalanced terminal, and each of the second divided IDT portions of the first, third, and fifth IDTs is connected to a ground potential;
   the second and fourth IDTs are connected to first and second balanced terminals, respectively; and
   metallization ratios of the first and second divided IDT portions are different from each other in at least one of the first third and fifth IDTs.

15. The acoustic wave filter device according to claim 14, wherein series weighting is applied to at least one of the IDTs that include the first and second divided IDT portions.

16. The acoustic wave filter device according to claim 14, wherein a surface acoustic wave is used as an acoustic wave and the acoustic wave filter device is a surface acoustic wave filter device.

17. The acoustic wave filter device according to claim 14, further comprising a dielectric substance layer laminated on the piezoelectric substrate, wherein the acoustic wave filter device is a boundary acoustic wave filter device that uses a boundary acoustic wave as an acoustic wave.

* * * * *